US006787814B2

(12) United States Patent
Udagawa

(10) Patent No.: US 6,787,814 B2
(45) Date of Patent: Sep. 7, 2004

(54) GROUP-III NITRIDE SEMICONDUCTOR LIGHT-EMITTING DEVICE AND PRODUCTION METHOD THEREOF

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/885,943

(22) Filed: Jun. 22, 2001

(65) Prior Publication Data

US 2001/0054717 A1 Dec. 27, 2001

Related U.S. Application Data

(60) Provisional application No. 60/247,989, filed on Nov. 14, 2000.

(30) Foreign Application Priority Data

Jun. 22, 2000 (JP) ........................... P2000-188214

(51) Int. Cl.$^7$ .................. H01L 29/24; H01L 29/22; H01L 29/221
(52) U.S. Cl. ................ 257/101; 257/79; 257/94; 257/95; 257/96; 257/102; 257/103
(58) Field of Search ................. 257/79–103; 372/43

(56) References Cited

U.S. PATENT DOCUMENTS

| 5,042,043 | A | * | 8/1991 | Hatano et al. ............. 372/45 |
| 5,326,424 | A | * | 7/1994 | Doll et al. .................. 117/105 |
| 5,612,551 | A | * | 3/1997 | Liu et al. .................... 257/197 |
| 6,069,021 | A | * | 5/2000 | Terashima et al. ........... 438/46 |
| 6,121,637 | A | * | 9/2000 | Isokawa et al. ............... 257/99 |
| 6,372,356 | B1 | * | 4/2002 | Thornton et al. ........... 428/469 |

FOREIGN PATENT DOCUMENTS

| JP | 10-242514 | | 9/1998 | ........... H01L/33/00 |
| JP | 10-242567 | | 9/1998 | ............. H01S/3/18 |
| JP | 10-242569 | | 9/1998 | ............. H01S/3/18 |
| JP | 411045892 A | * | 2/1999 | ......... H01L/21/338 |

OTHER PUBLICATIONS

O. Madelung (Editor), Semiconductors—Basic Data, $2^{nd}$ Revised Edition, Springer verlag. Berlin, Heidelberg, New York 1996, pp. 60–68. ISBN: 3–540–60883–4.*

Landolt–Bornstein—Condensed Matter (Springer Verlag, Berlin), data based on publs. during 1936–2000), Gallium nitride lattice parameters, thermal expansion—Semiconductors—Group III–V Comps.. Part a: Lattice Props. I1/41A1a, 2001.*

* cited by examiner

Primary Examiner—Nathan J. Flynn
Assistant Examiner—Johannes P. Mondt
(74) Attorney, Agent, or Firm—Sughrue Mion, PLLC

(57) ABSTRACT

A high emission intensity group-III nitride semiconductor light-emitting device obtained by eliminating crystal lattice mismatch with substrate crystal and using a gallium nitride phosphide-based light emitting structure having excellent crystallinity. A gallium nitride phosphide-based multilayer light-emitting structure is formed on a substrate via a boron phosphide (BP)-based buffer layer. The boron phosphide-based buffer layer is preferably grown at a low temperature and rendered amorphous so as to eliminate the lattice mismatch with the substrate crystal. After the amorphous buffer layer is formed, it is gradually converted into a crystalline layer to fabricate a light-emitting device while keeping the lattice match with the gallium nitride phosphide-based light-emitting part.

5 Claims, 4 Drawing Sheets

[Fig. 1]
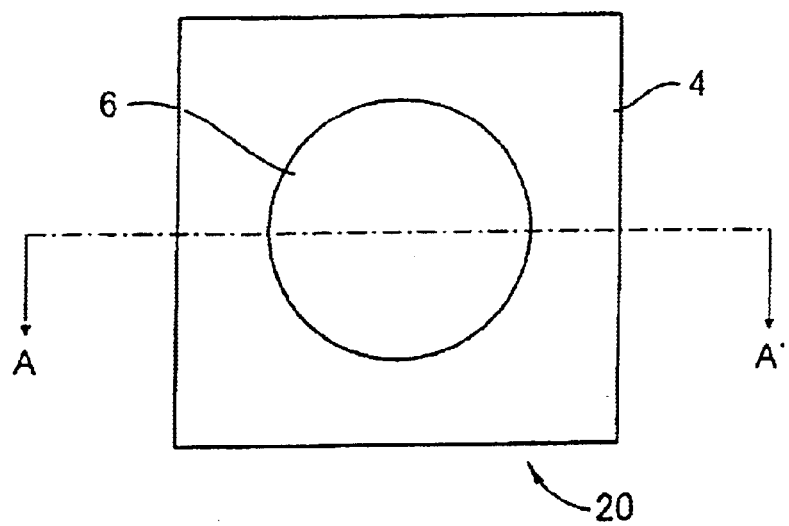
[Fig. 2]
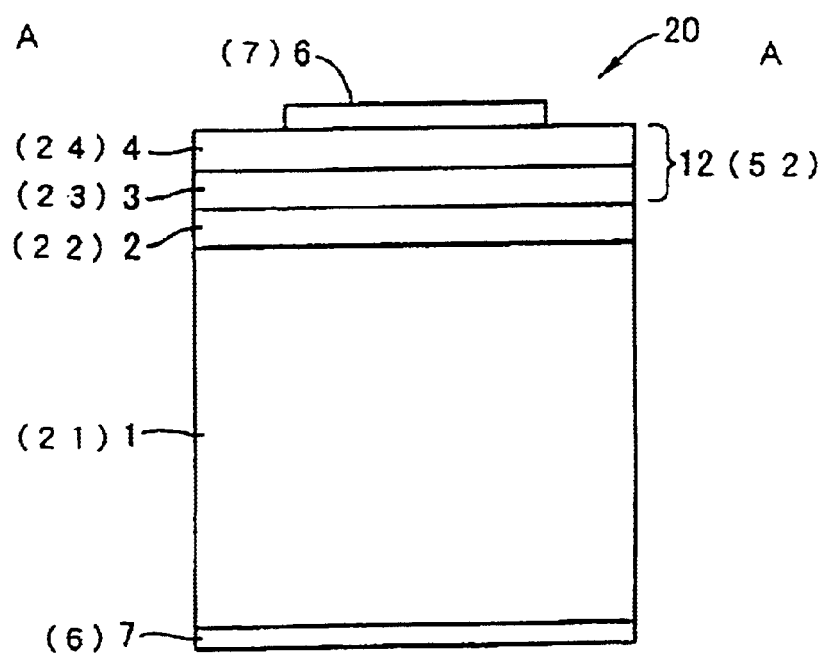

[Fig. 3]
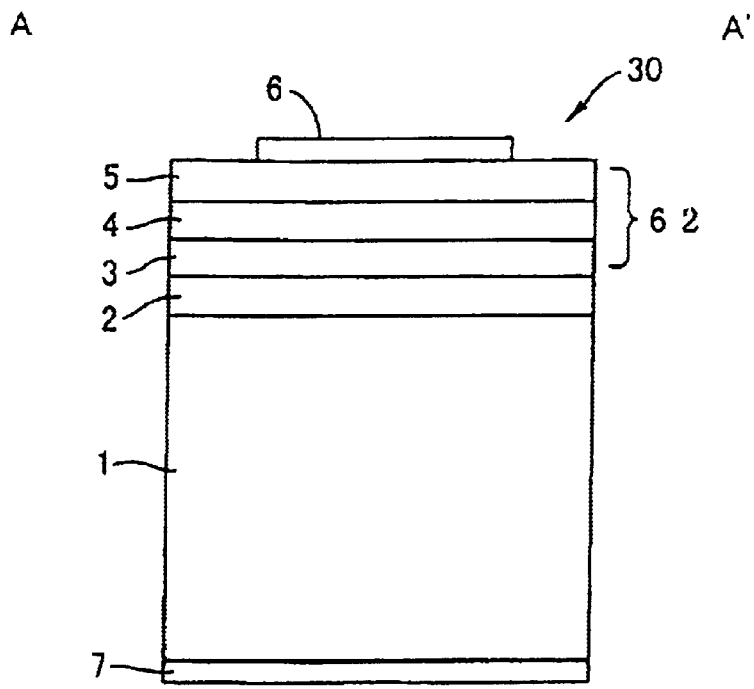
[Fig. 4]
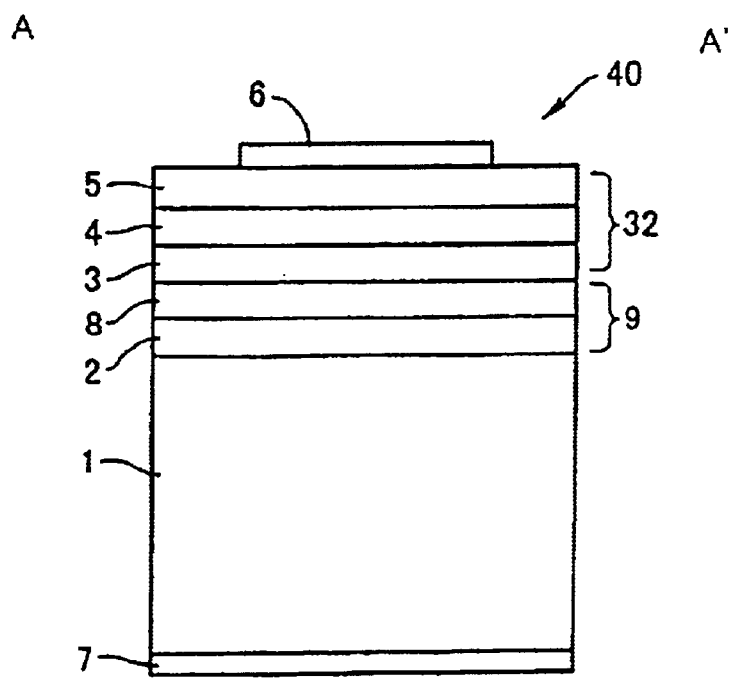

[Fig. 5]
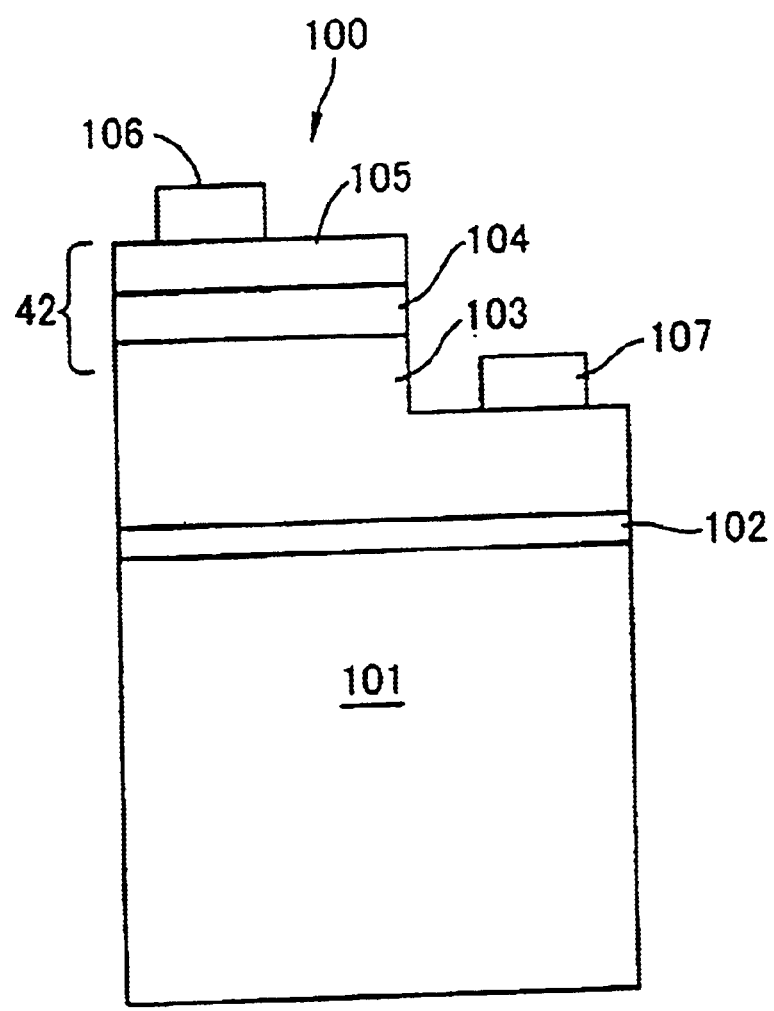

GROUP-III NITRIDE SEMICONDUCTOR LIGHT-EMITTING DEVICE AND PRODUCTION METHOD THEREOF

CROSS REFERENCE TO RELATED APPLICATIONS

This application is an application filed under 35 U.S.C. §111(a) claiming benefit pursuant to 35 U.S.C. §119(e)(1) of the filing date of Provisional Application 60/247,989 filed Nov. 14, 2000 pursuant to 35 U.S.C. §111(b).

FIELD OF THE INVENTION

The present invention relates to a group-III nitride semiconductor light-emitting device comprising a substrate such as silicon (Si) having on the surface thereof a light-emitting part structure containing a gallium nitride phosphide ($GaN_{1-x}P_x$, wherein $0<X<1$) single crystal layer provided via a boron phosphide (BP)-based buffer layer.

BACKGROUND OF THE INVENTION

A group-III nitride semiconductor light-emitting device that emits light in the blue or green band is composed of a multilayer structure where a gallium nitride (GaN) crystal layer as one constituent element is disposed, for example, on a sapphire ($\alpha$-$Al_2O_3$) single crystal substrate using a growing technique, such as metal organic chemical vapor deposition (MOCVD) method. The multilayer structure has a light-emitting part structure undertaking the function of emitting light. Conventionally, the light-emitting part structure in general takes a pn junction-type hetero structure constructed by a p-type or n-type clad layer consisting of a light-emitting layer formed of gallium indium nitride ($Ga_yIn_{1-y}N$, wherein $0<Y\leq1$) and an aluminum gallium indium nitride (AlGaInN)-based crystal layer.

FIG. 5 is a schematic sectional view showing an example of the construction of a conventional multilayer structure light-emitting device (LED) 100 having a pn junction-type double hetero (DH) junction light-emitting part structure 42 comprising an AlGaInN-base crystal layer. In a conventional multilayer structure, the light-emitting part structure 42 is composed of, for example, a lower clad layer 103 comprising an n-type aluminum gallium nitride ($Al_ZGa_{1-Z}N$, wherein $0\leq Z\leq1$) crystal layer, a light-emitting layer 104 comprising an n-type gallium indium nitride ($Ga_yIn_{1-y}N$) and an upper clad layer 105 comprising a p-type aluminum gallium nitride ($Al_ZGa_{1-Z}N$, wherein $0\leq Z\leq1$) (see, JP-A-6-260682 (the term "JP-A" as used herein means an "unexamined published Japanese patent application")). The functional layers 103 to 105 constituting the light-emitting part structure 42 each is usually deposited with an intervention of a buffer layer formed at a temperature lower than the temperature at the formation of those functional layers, so-called a low-temperature buffer layer 102 (see, JP-A-4-297023). Furthermore, in a multilayer structure comprising a sapphire substrate 101 having provided thereon a group-III nitride semiconductor crystal layer, the low-temperature buffer layer 102 is usually composed of aluminum gallium nitride ($Al_ZGa_{1-Z}N$, wherein $0\leq Z\leq1$) (see, JP-A-6-151962).

The low-temperature buffer layer 102 is provided mainly for the purpose of reducing the lattice mismatch between the sapphire substrate 101 and the lower clad layer 103 composed of $Al_ZGa_{1-Z}N$ crystal, thereby obtaining a good group-III nitride single crystal layer reduced in the density of crystal defects such as dislocation. Particularly, in a known conventional example, the low-temperature buffer layer 102 is composed of gallium nitride (GaN), the lower clad layer 103 is composed of a GaN layer formed at a high temperature in excess of the temperature for the formation of the low-temperature buffer layer 102, and the light-emitting layer 104 is composed of a gallium indium nitride mixed crystal phase (see, JP-A-6-216409).

Furthermore, in the conventional light-emitting device shown in FIG. 5, the substrate 101 is an insulating sapphire and therefore, a part of the lower clad layer 103 must be removed to provide an n-type ohmic electrode 107. A p-type ohmic electrode 106 is provided on the electrically conducting upper clad layer 105.

However, the mismatch between the sapphire substrate and the GaN layer constituting the low-temperature buffer layer is as high as about 13.8% (see, Nippon Kessho Seicho Gakkai Shi (Journal of Japan Crystal Growth Society), Vol. 15, Nos. 3 & 4, pp. 74–82 (Jan. 25, 1989)) and therefore, a continuous low-temperature buffer layer cannot be stably obtained at present. In the discontinuous portion partially present in the low-temperature buffer layer due to the lacking of film continuity, namely, in the region where the sapphire substrate surface is exposed, hexagonal GaN predominantly grows in the c-axis direction thereof. As a result, dislocation is generated starting from the coalescence of GaN columnar crystals, propagates to the GaInN light-emitting layer via the upper GaN layer and disadvantageously deteriorates the crystal quality of the light-emitting layer. In other words, according to the above-described conventional multilayer structure constructed by stacking a GaInN light-emitting layer on a GaN low-temperature buffer layer via a GaN layer, a good GaInN-type light-emitting layer film cannot be formed due to the propagation of crystal defects such as dislocation attributable to the discontinuity of the low-temperature buffer layer. Therefore, stable formation of a light-emitting part structure comprising a group-III nitride single crystal layer having excellent operation reliability or ensuring long device life cannot be attained particularly in the case of a laser diode (LD).

The present invention has been made by taking into account these problems in conventional techniques, and an object of the present invention is to provide a buffer layer having continuity capable of allowing homogeneous coating on the substrate surface and preventing generation of dislocations despite a large mismatch with the substrate crystal. Another object of the present invention includes providing a construction of a group-III nitride single crystal layer structure deposited on the above-described buffer layer, which is reduced in the density of crystal defects such as dislocation and favored with excellent crystallinity.

SUMMARY OF THE INVENTION

More specifically, the group-III nitride semiconductor light-emitting device of the present invention is a group-III nitride semiconductor light-emitting device comprising a single crystal substrate having thereon a light-emitting part structure containing a gallium nitride phosphide ($GaN_{1-x}P_x$, wherein $0<X<1$) single crystal layer provided via a boron phosphide (BP)-based buffer layer.

By using the boron phosphide-based buffer layer, the lattice mismatch of crystals between the substrate and the gallium nitride phosphide light-emitting part structure can be eliminated and a gallium nitride phosphide light-emitting part structure having excellent crystallinity can be formed. As a result, a high-emission intensity light-emitting device can be advantageously obtained.

In the group-III nitride semiconductor light-emitting device of the present invention, the boron phosphide-based buffer layer is amorphous.

The BP-based buffer layer is rendered amorphous by growing it at a low temperature, which has an effect of allowing the buffer layer to cope with a substrate having a lattice constant over a wide range.

In the group-III nitride semiconductor light-emitting device of the present invention, the BP-based buffer layer may be composed of an amorphous and crystalline multilayer structure.

By providing an amorphous BP-based buffer layer in the vicinity of an interface with the substrate and providing a crystalline BP-based buffer layer in the vicinity of the light-emitting part structure thereon, a gallium nitride phosphide light-emitting part structure having higher crystallinity can be advantageously obtained with ease.

In the group-III nitride semiconductor light-emitting device of the present invention, the light-emitting part structure may be a single hetero-junction structure containing a gallium nitride phosphide single crystal layer.

The light-emitting part can have good crystallinity and therefore, a high-emission intensity light-emitting device can be obtained even with a simple light-emitting part structure.

In the group-III nitride semiconductor light-emitting device of the present invention, the light-emitting part structure may be a double hetero-junction structure containing a gallium nitride phosphide single crystal layer.

By using a double hetero-junction structure, a light-emitting device having higher luminous intensity can be advantageously obtained.

In the group-III nitride semiconductor light-emitting device of the present invention, the degree of lattice mismatch between the BP-based buffer layer and the gallium nitride phosphide single crystal layer is preferably ±1% or less.

The degree of lattice mismatch between the BP-based buffer layer and the gallium nitride phosphide single crystal layer is more preferably ±0.4% or less.

This is because the lattice constant of boron phosphide-based buffer layer and the lattice constant of gallium nitride phosphide-based light-emitting layer can be approximated as close as possible by controlling the phosphorus composition. As the lattice mismatch is smaller, a good epitaxial crystal layer reduced in crystal defects can be more readily obtained, thereby contributing to the high-luminous intensity emission of the light-emitting device.

In the group-III nitride semiconductor light-emitting device of the present invention, the boron phosphide-based buffer layer is preferably composed of boron phosphide (BP) and in the light-emitting part structure, the gallium nitride phosphide single crystal layer preferably has a phosphorus (P) compositional ratio of 1 to 5%.

This is because the degree of lattice mismatch between the buffer layer and the light-emitting part is reduced to 1% or less, and as a result, a high-luminous intensity light-emitting device can be obtained.

Also, the present invention provides a lamp using the above-described group-III nitride semiconductor light-emitting device.

Furthermore, the present invention provides a light source using the above-described lamp.

The lamp using the group-III nitride semiconductor light-emitting device of the present invention and the light source using the lamp of the present invention each uses a high emission intensity light-emitting device and therefore, ensures brightness and excellent visibility.

The production method of a group-III nitride semiconductor light-emitting device of the present invention comprises a step of forming a boron phosphide (BP)-based buffer layer on a single crystal substrate and a step of providing a light-emitting part structure containing a gallium nitride phosphide ($GaN_{1-x}P_x$, wherein 0<X<1) single crystal layer.

By forming a boron phosphide (BP)-based buffer layer on a single crystal substrate and providing a light-emitting part structure containing a gallium nitride phosphide single crystal layer on the boron phosphide-based buffer layer, the lattice mismatch of crystal between the substrate and the gallium nitride phosphide crystal layer is relaxed, thereby forming a light-emitting part structure comprising gallium nitride phosphide crystal with excellent crystallinity.

The boron phosphide-based buffer layer is preferably amorphous. The buffer layer mainly composed of an amorphous has an effect of efficiently relaxing the lattice mismatch between the substrate and the gallium nitride phosphide single crystal layer or the like on the buffer layer.

Alternatively, the boron phosphide-based buffer layer preferably comprises an amorphous and crystalline multilayer structure. When an amorphous boron phosphide-based buffer layer is provided in a vicinity of the interface between the buffer layer and the substrate, and a crystalline boron phosphide-based buffer layer is provided in a vicinity between the buffer layer and the light-emitting part structure thereon, the obtained light-emitting part structure containing gallium nitride phosphide single crystal can readily have good crystallinity.

In the production method of a group-III nitride semiconductor light-emitting device of the present invention, the composition of the boron phosphide-based buffer layer or the gallium nitride phosphide single crystal layer is preferably controlled so that the degree of lattice mismatch between the boron phosphide-based buffer layer and the gallium nitride phosphide single crystal layer is ±1% or less, preferably ±0.4% or less. As the degree of lattice mismatch with the boron phosphide-based material constituting the buffer layer is smaller, the gallium nitride phosphide single crystal layer which becomes a light-emitting layer can have higher quality, whereby a high emission intensity semiconductor light-emitting device can be produced.

Furthermore, in the production method of a group-III nitride semiconductor light-emitting device of the present invention, the boron phosphide-based buffer is preferably composed of boron phosphide and the gallium nitride phosphide single crystal layer in the light-emitting part structure preferably has a phosphorus (P) compositional ratio of 1 to 5%. The boron phosphide is a binary compound and can be readily formed into a film by vapor phase growth means such as MOCVD method. When the phosphorus compositional ratio (X) of the gallium nitride phosphide ($GaN_{1-x}P_x$, wherein 0<X<1) single crystal layer is limited to the range from 1 to 5%, the degree of lattice mismatch with the boron phosphide constituting the buffer layer can be suppressed within about 0.4%, so that the formed $Gan_{1-x}P_x$ single crystal layer can have reduced the density of crystal defects such as dislocation and excellent crystallinity. As a result, a light-emitting layer having excellent crystallinity can be obtained and a high emission intensity semiconductor light-emitting device can be produced.

BRIEF DESCRIPTION OF THE DRAWINGS

FIG. 1 is a schematic plan view of the group-III nitride semiconductor light-emitting device described in Example 1.

FIG. 2 is a schematic sectional view along the line A–A' of FIG. 2.

FIG. 3 is a schematic sectional view of the group-III nitride semiconductor light-emitting device described in Example 2.

FIG. 4 is a schematic sectional view of the group-III nitride semiconductor light-emitting device described in Example 3.

FIG. 5 is a schematic sectional view of a conventional light-emitting device having an AlGaInN-based double hetero-junction structure.

DESCRIPTION OF THE PRESENT INVENTION

Figure 6:
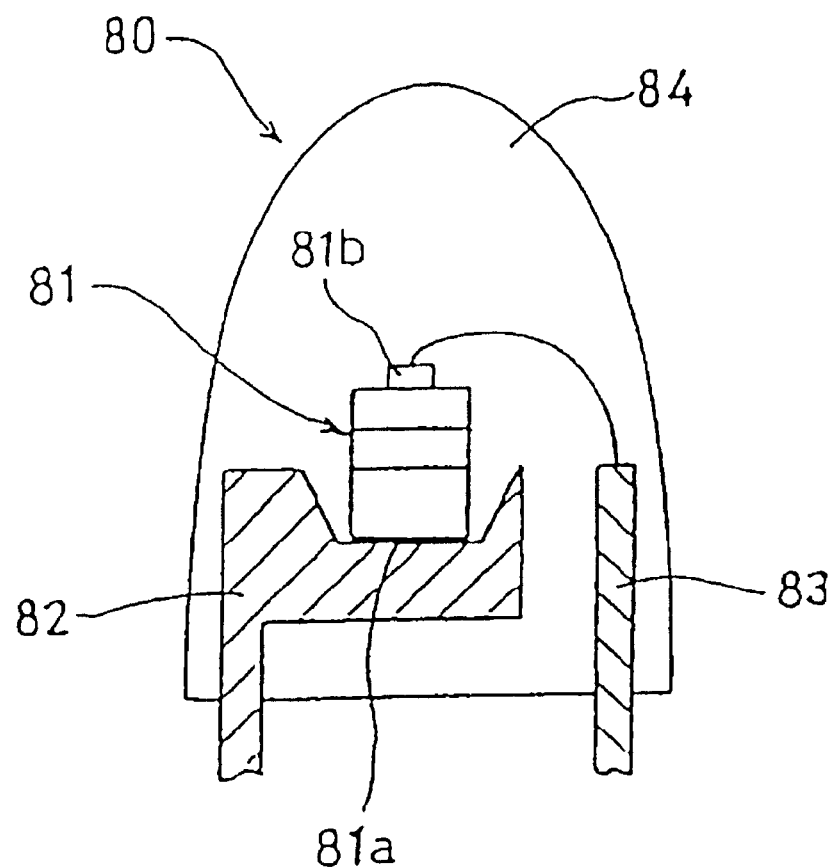
FIG. 6 is a view showing a lamp using a group-III nitride semiconductor light-emitting device of the present invention.

In the group-III nitride semiconductor light-emitting device of the present invention, the light-emitting part structure is formed on the surface of a substrate comprising a single crystal material.

The conduction type of the substrate may be either n-type or p-type as long as it is a single crystal material, because an ohmic electrode of either positive or negative electrode can be formed on one surface of the substrate by using the electrical conductivity of the substrate and an LED can be readily fabricated. For example, a cubic single crystal such as silicon (Si) and gallium phosphide (GaP) or an oxide single crystal such as silicon carbide (SiC) and perovskite type can be more suitably used as the substrate than an insulating single crystal material such as sapphire. In particular, an n-type or p-type silicon single crystal of diamond crystal structure type can be preferably used because of its clear cleavage property. When a {100}-silicon single crystal is used as the substrate, separation into individual devices can be readily and simply performed utilizing the cleavage, which is advantageous.

The buffer layer provided on the surface of the single crystal substrate is composed of a boron phosphide (BP)-based material. The BP-based material means a material containing at least boron (B) and phosphorus (P) as constituent elements. Examples of the BP-based material include boron phosphide nitride ($BP_MN_{1-M}$, wherein 0<M<1) in addition to boron phosphide (BP). The buffer layer comprising such a BP-based material can be formed by a MOCVD method, by a halogen vapor phase growth method using boron trichloride ($BCl_3$) as a boron (B) source or by a hydride vapor phase growth method using phosphine ($PH_3$) as a phosphorus (P) source.

In the present invention, a gallium nitride phosphide ($GaN_{1-X}P_X$, wherein 0<X<1) single crystal layer as a mixed crystal of gallium nitride (GaN) and gallium phosphide (GaP) is stacked via the buffer layer comprising a BP-based material, because by adjusting the phosphorus compositional ratio (X) of gallium nitride phosphide ($GaN_{1-X}P_X$, wherein 0<X<1), lattice matching with the boron phosphide-based material constituting the buffer layer can be attained. Therefore, in particular, a single crystal layer having excellent crystallinity can be obtained. Incidentally, the lattice constant of zinc blende crystal structure gallium phosphide (GaP) is 5.450 angstrom (Å) (see, Yasuharu Suematsu, *Hikari Device (Photo-Device)*, 1st ed., 8th imp., page 28, Corona Sha (May 15, 1997)). On the other hand, the lattice constant of cubic gallium nitride (GaN) is 4.510 Å (see, Isamu Akasaki (compiler), *III-Zoku Chikkabutsu Handotai (Group III Nitride Semiconductor)*, first ed., page 169, Table 9.1, Baifukan (De. 8, 1999)). Accordingly, as derived by the Vegard's rule (see, *III–V zoku Handotai Konsho (Groups III-V Semiconductor Mixed Crystal)*, first ed., 1st imp., pp. 27–31, Corona Sha (Oct. 25, 1988)), the lattice constant of $GaN_{0.97}P_{0.03}$ with a phosphorus compositional ratio of about 3% (X≈0.03) is 4.538 Å and matches with the lattice constant of boron phosphide (lattice constant: 4.538 Å) constituting the buffer layer. That is, the $GaN_{0.97}P_{0.03}$ layer stacked on the BP buffer layer maintains lattice matching with the buffer layer and therefore, advantageously becomes a single crystal layer having good crystallinity.

Furthermore, for example, on a buffer layer comprising boron phosphide nitride ($BP_{0.98}N_{0.02}$, lattice constant: 4.520 Å) having a nitrogen compositional ratio of 2% (M=0.02), a good gallium nitride phosphide ($GaN_{0.99}P_{0.01}$, lattice constant: 4.519 Å) single crystal layer can be stacked.

The gallium nitride phosphide single crystal layer can be formed by an MOCVD method or a halogen or hydride vapor phase growth method, similar to the BP-based buffer layer. At this time, the BP-based buffer layer and the $GaN_{1-X}P_X$ single crystal layer are preferably formed to have the same conduction type. A $GaN_{1-X}P_X$ layer having excellent crystallinity can be advantageously used as one constituent layer for constructing a light-emitting part of a single hetero-junction structure or a double hetero-junction structure, which enhances the emission intensity. For example, such $GaN_{1-X}P_X$ layer may be effectively used as a clad layer constituting the light-emitting part of a pn junction-type double hetero-junction structure.

When constructing the light-emitting part using the $GaN_{1-X}P_X$ (0<X<1) layer as a clad layer, the phosphorus compositional ratio must be selected to give a band gap larger than the transition energy corresponding to the light emission wavelength. For example, the transition energy corresponding to blue light emission at a wavelength of 450 nm is about 2.75 eV. The transition energy corresponding to green light emission at a wavelength of 520 nm is about 2.38 eV. Accordingly, the clad layer must be composed using $GaN_{1-X}P_X$ (0<X<1) having a phosphorus compositional ratio (X) giving a band gap of about 2.8 eV or more for the light-emitting layer of emitting blue light, and a phosphorus compositional ratio (X) giving a band gap of about 2.4 eV or more for the light-emitting layer of emitting green light. In view of the non-linear change in the band gap of $GaN_{1-X}P_X$ (see, *Appl. Phys. Lett.*, Vol. 60, No. 20, pp. 2540–2542 (1992)), $GaN_{1-X}P_X$ having a phosphorus compositional ratio (X) of about 5% (X≈0.05) or less is suitable for the clad layer, for example, in the case of a light-emitting layer of emitting blue or green light. $GaN_{1-X}P_X$ having a phosphorus compositional ratio (X) of 3% or less is more preferably used as a clad layer for the light-emitting layer of emitting blue or green light.

The BP-based buffer layer is most preferably composed mainly of an amorphous material in the as-grown state, because a buffer layer composed mainly of an amorphous material provides an effect of effectively relaxing the lattice mismatch between the substrate and the $GaN_{1-X}P_X$ (0<X<1) crystal layer or the like. By forming a film from a BP-based material at a low temperature as described below, the film can be formed in the amorphous state and mostly be free from the effect of the lattice constant of the substrate.

The lattice mismatch (Δ, unit: %) can be represented by the following relational expression (1):

$$\Delta(\%) \approx \{(A\text{-}As)/As\} \times 100 \qquad (1)$$

wherein "As" represents a lattice constant of a layer (underlying layer) on which another layer is deposited and "A" represents a lattice constant of a layer deposited on the underlying layer.

For example, the lattice mismatch (Δ) between a silicon single crystal (As: 5.431 Å) substrate and a crystalline BP (A: 4.538 Å) layer grown, as a layer on which another layer is deposited, is as large as −16.4% based on the silicon single crystal. In the case of using GaP single crystal (As: 5.450 Å) for the substrate, the lattice mismatch (Δ) between the GaP substrate and the BP buffer layer is −16.7%. However, when the buffer layer is composed of amorphous BP, the mismatch can be relaxed and the layer deposited thereon can have excellent flatness on the surface even when a large lattice mismatch of about 16% to about 17% is present. Moreover, even when the layer deposited is a thin layer having a relatively small thickness, for example, on the order of 0.2 μm, a continuous deposit layer film can be formed. It is believed that this effect is attributable to the fact that the BP-based material is an excellent material capable of coating the substrate surface without any intermittence even when the lattice mismatch between the BP-based material constituting the buffer layer and the substrate is large. Accordingly, in the present invention, the buffer layer is particularly preferably composed of an amorphous BP-based material.

The buffer layer composed of an amorphous BP-based material in the as-grown state can be obtained by setting the film formation temperature to a low temperature, approximately from about 250° C. to about 550° C., in the MOCVD method or the halogen or hydride vapor phase grown method. The film formation temperature is more preferably from about 300° C. to about 400° C. Whether the buffer layer is composed of an amorphous material or not can be known, for example, by ordinary means, such as X-ray diffraction analysis and electron beam diffraction analysis. When the buffer layer is mainly composed of an amorphous material, a diffraction peak scarcely appears on the X-ray diffraction pattern. Even when an amorphous layer is in the as-grown state, if the layer is exposed to an environment of high temperature exceeding the growing temperature of the buffer layer (e.g., if another layer is formed on the buffer layer at a higher temperature), the amorphous buffer layer in the vicinity of junction interface with the single crystal substrate displaces the lattice of the single crystal material and changes into a single crystal form (see, JP-A-10-22224). The lattice constant in the layer changed into single crystal form approximates the lattice constant of the single crystal constituting the substrate. Also in the inside region of the buffer layer, close to the junction interface, the amorphous layer changes into a single crystal layer using the layer converted into the single crystal form as a "seed crystal". As the layer thickness increases, the lattice constant becomes closer to the lattice constant of the original crystal of the material constituting the buffer layer.

When a single crystal layer having excellent crystallinity must be stacked on the amorphous buffer layer, the amorphous buffer layer is preferably changed into a crystal layer having a lattice constant of the original crystal of the material constituting the buffer layer, at least in the vicinity of the buffer layer surface opposite the junction interface with the substrate. By forming a film thereafter at a high temperature, a single crystal layer having excellent crystallinity can be obtained.

Whether or not the amorphous buffer layer can be successfully and homogeneously converted into a single crystal layer in the high temperature environment depends on the layer thickness of the amorphous buffer layer. If the amorphous buffer layer is an ultrathin film having a layer thickness of about 1 to less than 2 nm, the inside of the buffer layer is affected by the single crystal substrate and mostly converted into a single crystal layer when the buffer layer is exposed to a high temperature environment. Moreover, the lattice constant of the single crystal layer is approximated to the lattice constant of the substrate crystal and therefore, even if an epitaxial layer is further stacked on such a buffer layer having the same lattice constant as the substrate crystal, the lattice mismatch with the substrate cannot be sufficiently relaxed. As a result, the same results as in the case of directly depositing the layer on a substrate are exhibited, and a coarse crystal layer having a high density of crystal defects such as misfit dislocation due to the effect of mismatch is formed.

If the layer thickness of the amorphous buffer layer exceeds about 50 nm, a polycrystalline material conspicuously grows inside the amorphous layer even in the as-grown state. If a polycrystalline material is present together inside the amorphous layer, the crystal structure becomes heterogeneous inside the amorphous layer and in turn, the activity of relaxing the lattice mismatch disadvantageously becomes inhomogeneous. Furthermore, the buffer layer is prevented from converting into a single crystal layer due to the polycrystalline material already existing in the as-grown state and the polycrystalline material exposed to the surface of the buffer layer sometimes disadvantageously prevents the growth of a single crystal layer having homogeneous orientation. The layer thickness of the buffer layer is suitably on the order from about 5 nm to about 50 nm where the polycrystalline material present together in the as-grown state is greatly reduced and at the same time, a single crystal layer having a lattice constant inherent in the constituent material of the buffer layer is formed.

In the present invention, on the BP-based amorphous layer grown at the above-described low temperature, a single crystal layer comprising a BP-based material is further stacked to constitute a buffer layer comprising the amorphous layer and the single crystal layer stacked thereon. The BP-based low-temperature buffer layer mainly comprising an amorphous material in the as-grown state exerts an effect of relaxing the lattice mismatch with the substrate crystal, such as GaP, to ensure the formation of an epitaxial layer having excellent crystallinity. More specifically, the amorphous buffer layer comprising a BP-based material acts as an underlying layer capable of relaxing the lattice mismatch with the single crystal substrate, and is suitable for forming thereon a BP single crystal layer reduced in the density of crystal defects such as misfit dislocation and having excellent crystallinity. By using the BP-based single crystal layer having excellent crystallinity as an underlying layer, the gallium nitride phosphide single crystal layer stacked thereon can displace the good crystallinity of the underlying layer and can have excellent crystallinity. For example, a buffer layer of a double layer structure consisting an amorphous buffer layer comprising boron phosphide (BP) and a single crystal layer formed thereon comprising the same boron phosphide is constructed. The boron phosphide-based single crystal layer deposited on this buffer layer of a double layer structure can be formed by the MOCVD method using triethyl boron $((C_2H_5)_3B)$/phosphine $(PH_3)$/hydrogen $(H_2)$ as a starting material gas, similar to the case of amorphous layer. By doping n-type or p-type impurities during formation of a boron phosphide film for the amorphous layer or for the single crystal layer, a buffer layer having an n-type or p-type conductivity can be formed. When forming a buffer layer of a plurality of layers, the respective layers constituting the buffer layer are preferably formed to have the same conduction type.

In the present invention, when the gallium nitride phosphide (GaN$_{1-X}$P$_X$, wherein 0<X<1) single crystal layer stacked above via the buffer layer comprising a BP-based material is used as the lower clad layer, a single hetero (SH) junction-type light-emitting part structure can be constructed. For example, when a clad layer composed of a p-type GaN$_{0.97}$P$_{0.03}$ single crystal layer stacked on a buffer layer comprising p-type boron phosphide and an n-type gallium indium nitride (Ga$_Y$In$_{1-Y}$N) light-emitting layer are used, a light-emitting part structure of pn junction-type single hetero structure is formed. The boron phosphide (BP) constituting the buffer layer is a zinc blende-type cubic crystal and therefore, a cubic GaN$_{1-X}$P$_X$ film can be finely formed thereon. In view of the band structure, a p-type crystal layer can be readily obtained by using a zinc blende-type boron phosphide (BP) crystal compared with using hexagonal GaN (see, JP-A-2-275682). Accordingly, when the buffer layer is composed of a BP-based material, a p-type GaN$_{1-X}$P$_X$ single crystal layer film can be readily formed thereon and this is advantageous in obtaining a pn junction-type single hetero-junction light-emitting part structure. In another example, the single hetero-junction light-emitting part structure comprises a GaN$_{1-X}$P$_X$ clad layer lying on the BP-based buffer layer and a GaN$_{1-X}$P$_X$ light-emitting layer having a conduction type opposite thereto.

In the present invention, a light-emitting part structure of a double hetero (DH) junction structure may also be constructed by using a gallium nitride phosphide (GaN$_{1-X}$P$_X$, wherein 0<X<1) single crystal layer stacked via a BP-based buffer layer as a lower clad layer. The double hetero junction-type light-emitting part structure containing a GaN$_{1-X}$P$_X$ (0<X<1) single crystal layer may be constructed so that an n-type or p-type GaN$_{1-X}$P$_X$ P layer is the lower clad layer, a gallium indium nitride layer (Ga$_Y$In$_{1-Y}$N, wherein 0≦Y≦1) is the light-emitting layer, and an aluminum gallium nitride (Al$_Z$Ga$_{1-Z}$N, wherein 0≦Y≦1) layer having a conduction type opposite the conduction type of the lower clad layer is the upper clad layer. In this embodiment, when the light-emitting layer is composed of Ga$_Y$In$_{1-Y}$ (0≦Y≦1) ensuring good lattice match with the GaN$_{1-X}$P$_X$ layer undertaking the lower clad layer, the light-emitting layer can effectively work as a hetero-junction light-emitting structure of emitting high-intensity light. Examples thereof include a light-emitting part structure containing a lower clad layer of GaN$_{0.95}$P$_{0.05}$ (a=4.557 Å) and a light-emitting layer of cubic Ga$_{0.90}$In$_{0.10}$N having a gallium compositional ratio (=Y) of 90% (Y=0.90) ensuring lattice matching with the lower clad layer. Another example is a hetero-junction light-emitting part structure having a hetero-junction of GaN$_{0.99}$P$_{0.01}$ layer and Ga$_{0.96}$In$_{0.04}$N layer. In any exemplified construction of the light-emitting part structure, a light-emitting layer having good lattice matching becomes a light-emitting layer having excellent crystallinity and in turn, a group-III nitride semiconductor light-emitting device capable of emitting high-intensity light is obtained.

In the case of a SH junction, as the degree of lattice mismatch (Δ) with the BP-based material constituting the buffer layer is smaller, the GaN$_{1-X}$P$_X$ (0<X<1) single crystal layer which becomes a light-emitting layer is obtained as a crystal layer having higher quality. Incidentally, when lattice mismatch is absent between the buffer layer and the GaN$_{1-X}$P$_X$ single crystal layer and these layers are in the lattice matching relationship, the degree of lattice mismatch is 0 (namely, Δ=0). By setting the degree of lattice mismatch (Δ) to about ±1% or less, preferably ±0.4% or less, a GaN$_{1-X}$P$_X$ (0<X<1) single crystal layer having excellent crystallinity can be obtained. The degree of lattice mismatch between the buffer layer and the GaN$_{1-X}$P$_X$ single crystal layer is determined based on the lattice constant of the buffer layer. In this case, when the GaN$_{1-X}$P$_X$ single crystal layer has a lattice constant larger than that of the buffer layer, the degree of lattice mismatch is a positive value, whereas this relationship of lattice constant size is reversed, the degree of lattice mismatch comes out as a negative value.

The lattice constant of cubic boron nitride (BN) is 3.615 Å (see, Yasuharu Suematsu, *Hikari Device* (*Photo-Device*), p. 28) and accordingly, the lattice constant (a$_1$) of the BP$_X$N$_{1-X}$ single crystal can be represented by the following formula (2):

$$a_1(\text{Å})=3.615+0.923 \cdot X \qquad (2)$$

On the other hand, the lattice constant (a$_2$) of cubic gallium nitride phosphide (GaN$_{1-X}$P$_X$, wherein 0<X<1) is calculated according to the following formula (3) based on the Vegard's rule:

$$a_2(\text{Å})=4.510+0.940 \cdot X \qquad (3)$$

For example, the lattice constant (a$_1$) of BP$_{0.99}$N$_{0.01}$ having a phosphorus compositional ratio (X) of 0.99 is 4.530 Å according to formula (2). The degree of lattice mismatch (Δ) within ±0.4% of the lattice constant 4.530 Å is given by GaN$_{1-X}$P$_X$ having a lattice constant (a$_2$) of 4.512 to 4.548 Å according to formula (1). The lattice constant (a$_2$) of this range is given by GaN$_{1-X}$P$_X$ having a phosphorus compositional ratio (X) of 0.2 to 4.0% according to formula (3). In other words, a light-emitting part structure having a SH or DH structure and comprising a good crystal layer can be constructed when a GaN$_{1-X}$P$_X$ single crystal layer having a phosphorus compositional ratio (X) of 0.2 to 4.0% is stacked on the BP$_{0.99}$N$_{0.01}$ buffer layer.

In comparison with the above-described BP$_X$N$_{1-X}$ ternary mixed crystal, boron phosphide is a binary compound and therefore, the film formation thereof can be readily and simply performed by a vapor phase growth method such as MOCVD. That is, conveniently, the buffer layer of the present invention can be more readily formed. According to formula (3), the lattice constant of GaN$_{1-X}$P$_X$ having a phosphorus compositional ratio of 3% (X=0.03) is the same as the lattice constant (a=4.538 Å) of a boron phosphide (BP) monomer as described above. The lattice constant of gallium nitride phosphide (GaN$_{1-X}$P$_X$, wherein 0.01≦X≦0.05) having a phosphorus compositional ratio (X) of 1% (X=0.01) to 5% (X=0.05) is from 4.519 Å (when X=0.01) to 4.557 Å (when X=0.05). When the phosphorus compositional ratio (X) is set to fall within this range, the degree of lattice mismatch with BP constituting the buffer layer is suppressed to about 0.4% or less. Therefore, a GaN$_{1-X}$P$_X$ single crystal layer reduced in the density of crystal defects such as dislocation attributable to the lattice mismatch and having excellent crystallinity can be obtained.

The buffer layer comprising a boron phosphide material of the present invention exerts an effect of relaxing the degree of lattice mismatch between the single crystal material as the substrate and the gallium nitride phosphide (GaN$_{1-X}$P$_X$, wherein 0<X<1) provided on the buffer layer, thereby giving a GaN$_{1-X}$P$_X$-base lower clad layer reduced in the density of crystal defects with excellent crystallinity. The light-emitting layer or the like, which is stacked on the GaN$_{1-X}$P$_X$-base lower clad layer having excellent crystallinity formed via a buffer layer composed of a BP-based material, can have good crystallinity by taking over good crystallinity of the lower clad layer. Therefore, the light-emitting layer or the like can exert an effect of giving a light-emitting part structure capable of emitting high-intensity light.

The BP-based buffer layer composed of an amorphous substance of the present invention particularly has an effect of relaxing the degree of lattice mismatch with the single crystal substrate material.

Furthermore, when a BP-based buffer layer comprising an amorphous and crystalline multilayer structure is used, an effect of relaxing the degree of lattice mismatch with the substrate is achieved, thereby providing a good-quality gallium nitride phosphide ($GaN_{1-X}P_X$) single crystal layer reduced in the density of crystal defects with excellent crystallinity.

Whichever a single hetero-junction structure or a double hetero-junction structure the light-emitting part structure may take, the group-III nitride semiconductor light-emitting device of the present invention similarly provides an effect of emitting high-intensity light by reflecting good crystallinity of the light-emitting part.

In the group-III nitride semiconductor light-emitting device of the present invention, the gallium nitride phosphide single crystal layer is reduced in lattice mismatch with the BP-based buffer layer to ±1% or less and therefore, contributes to the construction of a single hetero- or double hetero-junction structure light-emitting part comprising a crystal layer having excellent crystallinity.

By reducing the degree of lattice mismatch with a BP buffer layer to ±0.4% or less, more excellent crystallinity can be obtained and therefore, light emission with higher intensity can be attained.

EXAMPLES

The group-III nitride semiconductor light-emitting device of the present is described in detail below by referring to Examples, which should not be construed as limiting the scope of the present invention. Unless indicated otherwise herein, all parts, percents, ratios and the like are by weight.

Example 1

FIG. 1 is a schematic plan view of a gallium nitride (GaN)-based blue LED having a light-emitting part structure of single hetero (SH) structure containing a gallium nitride phosphide crystal layer. FIG. 2 is a schematic sectional view cut along the line A–A' of FIG. 1, showing a multilayer structure of gallium nitride (GaN)-based blue LED shown in FIG. 1.

An epitaxial multilayer structure having a light-emitting part structure 12 of single hetero-junction structure was constructed by stacking layers on the surface of a single crystal substrate 1 comprising a p-type silicon having a (100) plane azimuth and having added thereto boron (B), by respective vapor phase growth methods described in the following items (1) to (3).

(1) A low-temperature buffer layer 2 comprising Zn-doped p-type boron phosphide (BP) was deposited using a mixed gas of triethyl borane (($C_2H_5)_3B$)/phosphine ($PH_3$)/ hydrogen ($H_2$) as the starting material gas. The layer was formed at a temperature of 350° C. under a normal pressure (almost atmospheric pressure) by the MOCVD method while setting the feed ratio (V/III ratio) of $PH_3/(C_2H_5)_3B$ to about 300. The obtained low-temperature buffer layer 2 comprising boron phosphide was amorphous in the as-grown state and had a layer thickness of about 45 nm.

(2) On this p-type BP low-temperature buffer layer 2, a lower clad layer 3 comprising a zinc blende crystal-structure Zn-doped p-type $GaN_{0.97}P_{0.03}$ single crystal layer having a phosphorus compositional ratio of 3% (X=0.03) was formed by the MOCVD method using dimethyl zinc ($(CH_3)_2Zn$) as a Zn doping source and using a mixed gas of trimethyl gallium (($CH_3)_3Ga$)/ammonia ($NH_3$)/phosphine ($PH_3$)/ hydrogen ($H_2$) as a starting material gas. The film formation temperature was about 950° C., the layer thickness was about 2.0 μm and the carrier concentration was about $2\times10^{18}$ $cm^{-3}$.

(3) On this lower clad layer 3, a light-emitting layer 4 comprising an n-type gallium indium nitride mixed crystal ($Ga_{0.97}In_{0.03}N$) layer having an indium (In) compositional ratio of about 3% (X=0.03) was formed by the MOCVD method under atmospheric pressure using trimethyl gallium (($CH_3)_3Ga$)/cyclopentadienyl indium (I) (($C_5H_5In(I)$)/ ammonia ($NH_3$)/hydrogen ($H_2$) as a starting material gas. The film formation temperature was 880° C. and the film thickness was about 0.5 μm.

The pn junction-type SH junction light-emitting part structure 12 was composed of the lower clad layer 3 comprising a p-type $GaN_{0.97}P_{0.03}$ single crystal layer and the light-emitting layer 4 comprising an n-type $Ga_{0.97}In_{0.03}N$ layer.

In the vicinity of junction interface between the single crystal substrate 1 and the low-temperature buffer layer 2, which is amorphous in the as-grown state, a single crystal layer having a lattice constant approximate to the lattice constant of silicon single crystal grew during the process of performing the vapor phase growth of epitaxially grown layers described in (2) and (3) above. In a position slightly distant from the junction interface with the single crystal substrate 1, crystal grains are generated. In the layer close to the surface opposite the junction face of the low-temperature buffer layer 2 with the single crystal substrate 1, the amorphous layer changes into a single crystal layer using the crystal grains as a "seed" (growth nuclei). By taking into account this growth form, the lattice constant (a) on the surface of the low-temperature buffer layer 2 on the side opposite the junction interface with the single crystal substrate 1 is 4.538 Å. The lattice constant of the lower clad layer 3 comprising a $GaN_{0.97}P_{0.03}$ single crystal layer becomes 4.538 Å according to relational formula (3) above. Based on these lattice constants, the degree of lattice mismatch between respective layers is calculated and found as follows.

(i) The degree of lattice mismatch between the BP low-temperature buffer layer 2 and the surface portion of the $GaN_{0.97}P_{0.03}$ lower clad layer 3 was 0 (zero) (namely, these two members were in a lattice matching relationship) based on the BP crystal.

Also, when the Vegard's rule was applied, the lattice constant of cubic $Gao_{0.97}In_{0.03}N$ was calculated as 4.524 Å.

(ii) Accordingly, the lattice mismatch (Δ) between the lower clad layer 3 comprising $GaN_{0.97}P_{0.03}$ single crystal (a=4.538 Å) and the cubic $Ga_{0.97}In_{0.03}N$ (a=4.524 Å) light-emitting layer 4 was –0.3% based on the lattice constant of $GaN_{0.97}P_{0.03}$.

Generally, a conventional clad layer comprising a GaN-based crystal layer provided on a sapphire substrate via a gallium nitride (GaN)-based low-temperature layer has a dislocation density on the order of $5\times10^8$ to $2\times10^9$ $cm^{-2}$ (see. *Mater. Res. Soc. Symp. Proc.*, Vol. 395, "Mater. Res. Soc." pp. 889–895 (1996)).

On the other hand, when observed by the sectional TEM method in general using a transmission electron microscope (TEM), it was confirmed that the p-type $GaN_{0.97}P_{0.03}$ single crystal layer constituting the clad layer 3 of this Example had a dislocation density of about $10^5$ $cm^{-2}$ to about $10^6$ $cm^{-2}$ because lattice match with the BP low-temperature buffer layer 2 was maintained. With respect to the degree of lattice mismatch, a maximum degree of lattice mismatch is present between the silicon single crystal substrate 1 and the BP low-temperature buffer layer 2. However, as in this Example, when the buffer layer is composed of BP grown at a low temperature and mainly comprises an amorphous material in the as-grown state, the lattice mismatch can be reduced by virtue of the lattice mismatch-relaxing activity of the amorphous material. Therefore, a surface state suitable for constructing the light-emitting part, such as clad layer, can be obtained. By forming a clad layer on this buffer layer, a single crystal layer reduced in the dislocation density and having excellent crystallinity can be obtained. On the thus-obtained lower clad layer 3, a light-emitting layer 4 is formed, and as a result, the light-emitting layer is also reduced in the dislocation density to the same extent. This reveals that according to the present invention, a light-emitting part structure 12 of SH junction is constructed by a good crystal layer reduced in the density of crystal defects.

On the light-emitting layer 4 as the uppermost layer of the light-emitting part structure 12 of SH junction, an n-type ohmic circular electrode 6 comprising gold (Au) and having a diameter of about 130 μm was formed using a well-known photolithography technique. Also, almost throughout the back surface of the silicon single crystal substrate 1, a p-type ohmic electrode 7 comprising aluminum (Al) was formed to fabricate a group-III nitride semiconductor light-emitting device 20. Thereafter, the multilayer structure having formed thereon n-type and p-type ohmic electrodes 6 and 7 was divided into individual devices (chips) by means of a general scribing technique, utilizing the clear cleavage property in the [110] direction of the silicon single crystal substrate 1. The chip was formed to have a square planar shape with a one-side length of about 350 μm.

A forward operating current was passed to n-type and p-type ohmic electrodes 6 and 7, and as a result, the following light emission properties were obtained.

(A) Light emission wavelength: 410 nm (B) Luminous emission intensity: 0.4 cd (forward current: 20 mA)

(C) Forward voltage: 3.6 V (forward current: 20 mA)

(D) Backward voltage: 20 V or more (reverse current: 10 μA)

As in this Example, a pn junction-type single hetero-junction light-emitting part structure can be constructed using a gallium nitride phosphide layer having excellent crystallinity and therefore, a group-III compound semiconductor light-emitting device ensuring high-intensity emission can be provided.

Example 2

In this Example, the present invention is described by referring to a group-III nitride semiconductor light-emitting device having a light-emitting part structure of double hetero (DH) structure containing a gallium nitride phosphide single crystal layer.

FIG. 3 is a schematic sectional view of a gallium nitride (GaN)-based blue LED fabricated based on a multilayer structure having a light-emitting part structure of DH structure according to the present invention.

In FIG. 3, the same constituent elements as in FIG. 2 are indicated by the same reference numbers and not described here.

On the same silicon single crystal substrate 1 as used in Example 1, a BP low-temperature buffer layer 2 was stacked and thereon, a lower clad layer 3 comprising $GaN_{0.97}P_{0.03}$ single crystal was stacked. On this lower clad layer, respective crystal layers described in the following items (1) and (2) were stacked to construct a multilayer structure.

(1) A light emitting layer 4 comprising an n-type gallium indium nitride ($Ga_{09.4}In_{0.06}N$) mixed crystal layer having an average indium (In) compositional ratio of about 6% (Y≈0.06) was formed by the MOCVD method under atmospheric pressure using trimethyl gallium (($CH_3)_3Ga$)/cyclopentadienylindium(I) (($C_5H_5In(I)$)/ammonia ($NH_3$)/hydrogen ($H_2$) as a starting material gas. The growing temperature was 880° C. This light-emitting layer 4 was composed of a multi-phase structure consisting of a plurality of phases different in the In composition and the layer thickness thereof was about 10 nm.

The GaInN layer of multi-phase structure means a crystal layer composed of a main phase comprising a GaInN layer and a subordinate phase having an indium concentration different from the main phase and mainly comprising microcrystal entities subordinately scattered in the main phase.

(2) An upper clad layer 5 comprising an Si-doped n-type gallium nitride (GaN) layer was grown by the MOCVD method under reduced pressure using trimethyl gallium (($CH_3)_3Ga$)/ammonia ($NH_3$)/hydrogen ($H_2$) as a starting material gas. The growing temperature was 1,080° C., the layer thickness was about 0.1 μm and the carrier concentration was about $2 \times 10^{17}$ $cm^{-3}$.

The light-emitting part structure 62 of DH junction structure was constructed such that the p-type $GaN_{0.97}P_{0.03}$ single crystal was the lower clad layer 3, the multi-phase structure $Ga_{0.94}In_{0.06}N$ layer was the light-emitting layer 4 and the n-type GaN layer was the upper clad layer 5.

The degree of lattice mismatch (Δ) between respective constituent layers constructed above was as follows.

(i) Similarly to Example 1, the degree of lattice mismatch (Δ) between the BP low-temperature buffer layer 2 and the lower clad layer 3 comprising $GaN_{0.97}P_{0.03}$ single crystal was 0 based on the BP crystal (namely, these layers were in a lattice matching relationship).

(ii) The degree of lattice mismatch (Δ) between the lower clad layer 3 comprising $GaN_{0.97}P_{0.03}$ single crystal (a=4.538 Å) and the light-emitting layer 4 comprising cubic $Ga_{0.94}In_{0.06}N$ (a=4.538 Å) was 0 (zero) based on the lattice constant of $GaN_{0.97}P_{0.03}$ (namely, these layers were in a lattice matching relationship).

(iii) The degree of lattice mismatch (Δ) between the light-emitting layer 4 comprising $Ga_{0.94}In_{0.06}N$ (a=4.538 Å) and the upper clad layer 5 (a=4.510 Å) comprising cubic GaN was −0.6% based on the lattice constant of $Ga_{0.94}In_{0.06}N$.

Similar to Example 1, the degree of lattice mismatch (Δ) between the low-temperature buffer layer 2 comprising BP and the lower clad layer 3 comprising $GaN_{0.97}P_{0.03}$ single crystal layer was 0 (zero), (namely, these layers were in a lattice matching relationship). At the same time, in this Example, the lattice mismatch between the lower clad layer 3 comprising a $GaN_{0.97}P_{0.03}$ single crystal layer and the light-emitting layer 4 comprising $Ga_{0.94}In_{0.06}N$ was also 0. Thus, a light-emitting layer 4 reduced in crystal defects attributable to the lattice mismatch was formed.

When observed by the sectional TEM method in general using a transmission electron microscope, it was confirmed that the dislocation density of the p-type $GaN_{0.97}P_{0.03}$ single crystal layer constituting the lower clad layer 3 of this Example was from about $10^5$ $cm^{-2}$ to $10^6$ $cm^{-2}$ because lattice match with the BP buffer layer 2 was maintained. In particular, the dislocation density of the $Ga_{0.94}In_{0.06}N$ layer constituting the light-emitting layer 4 was reduced to about $5\times10^5$ cm$^{-2}$, which was about ½ of the dislocation density in Example 1. This reveals that according to this Example, the light-emitting part could be composed of a good light-emitting layer more reduced in the density of crystal defects.

In the same manner as in Example 1, an n-type ohmic circular electrode 6 comprising gold (Au) and having a diameter of about 130 µm was formed on the upper clad layer 5 as the uppermost layer of the multilayer structure, using a well-known photolithography technique. Also, almost throughout the back surface of the silicon single crystal substrate 1, a p-type ohmic electrode 7 comprising aluminum (Al) was formed to fabricate a group-III nitride semiconductor light-emitting device 30. Thereafter, the multilayer structure having formed thereon n-type and p-type ohmic electrodes 6 and 7 was divided into individual chips by means of a general scribing technique, utilizing the clear cleavage property in the [110] direction of the silicon single crystal substrate 1. The chip had a square planar shape with a one-side length of about 350 µm.

A forward operating current was passed to n-type and p-type ohmic electrodes 6 and 7, and as a result, the following light emission properties were obtained.

(A) Light emission wavelength: 430 nm (B) Luminous emission intensity: 0.8 cd (forward current: 20 mA)

(C) Forward voltage: 3.8 V (forward current: 20 mA)

(D) Backward voltage: 20 V or more (reverse current: 10 µA)

According to the multilayer structure of this Example, a pn junction-type DH junction light-emitting part structure can be constructed so that a gallium nitride phosphide layer having good lattice match with the BP low-temperature buffer layer, and therefore, favored with excellent crystallinity is used as a clad layer. A gallium indium nitride layer having lattice match with the clad layer and favored with excellent crystallinity was used as a light-emitting layer. Therefore, a group-III compound semiconductor light-emitting device ensuring particularly high-intensity light emission was provided.

Example 3

In this Example, the present invention is described by referring to a group-III nitride semiconductor blue light-emitting device having a DH junction light-emitting part structure containing a gallium nitride phosphide single crystal layer stacked on a buffer layer of a double layer structure.

FIG. 4 is a schematic sectional view of a gallium nitride-based LED fabricated based on a multilayer structure having a light-emitting part structure of DH structure according to the present invention. In FIG. 4, the same constituent elements as in FIG. 1 are indicated by the same reference numbers and not described here.

A low-temperature buffer layer 2 comprising boron phosphide (BP) was formed on a silicon single crystal substrate 1 under the growth conditions described in Example 1. On the low-temperature buffer layer 2, a crystalline buffer layer 8 comprising a zinc (Zn)-doped p-type boron phosphide (BP) crystal layer was stacked. The crystalline buffer layer 8 comprising BP was grown at 980° C. using the MOCVD vapor phase growth technique described in Example 1. The carrier concentration of the crystalline buffer layer 8 was about $2\times10^{18}$ cm$^{-3}$ and the layer thickness was about 0.8 µm. In this Example, a buffer layer 9 is composed of a double layer structure of low-temperature buffer layer 2 and crystalline buffer layer 8 grown at a higher temperature as above. On the buffer layer 9 comprising a double layer structure, a pn junction-type double hetero-junction light-emitting part structure 32 having the crystal layer construction described in Example 2 was stacked to fabricate a group-III nitride semiconductor light-emitting device 40 of pn junction-type DH structure.

In the multilayer structure of this Example, unlike Examples 1 and 2, a lower clad layer 3 comprising a p-type $GaN_{0.97}P_{0.03}$ single crystal layer is deposited on the crystalline buffer layer 8 comprising BP, which is the same constituent material as in the low-temperature buffer layer 2. The crystalline buffer layer 8 comprising BP single crystal and the lower clad layer 3 comprising $GaN_{0.97}P_{0.03}$ single crystal layer were matched in the lattice constant. Accordingly, on the crystalline buffer layer 8 comprising a BP single crystal layer and constituting the double structure buffer layer 9, a good $GaN_{0.97}P_{0.03}$ single crystal layer reduced particularly in the density of crystal defects such as misfit dislocation was produced.

In the same manner as in Example 2, an n-type ohmic electrode 6 comprising Au and a p-type ohmic electrode 7 comprising Al were formed on the front and back surfaces of the multilayer structure using a well-known photolithography technique to fabricate a group-III nitride semiconductor light-emitting device 40. A forward operating current was passed to n-type and p-type ohmic electrodes 6 and 7, and as a result, the following light emission properties were obtained.

(A) Light emission wavelength: 430 nm (B) Luminous emission intensity: 1.0 cd (forward current: 20 mA)

(C) Forward voltage: 3.7 V (forward current: 20 mA)

(D) Backward voltage: 20 V or more (reverse current: 10 µA)

The buffer layer was composed of a double layer structure such that an amorphous low-temperature buffer layer comprising BP and a crystalline buffer layer comprising BP single crystal were superposed. Therefore, a gallium nitride phosphide layer particularly excellent in crystallinity was obtained and by using this layer as a clad layer, a pn junction-type DH junction light-emitting part structure was constructed. As a result, a group-III nitride semiconductor light-emitting device ensuring high luminous intensity light emission as described above was obtained.

Example 4

In this Example, the present invention is described by referring to a group-III nitride semiconductor green light-emitting device having a DH junction light-emitting part structure containing a gallium nitride phosphide single crystal layer stacked on a silicon single crystal substrate via a BP buffer layer. The multilayer structure construction is the same as in FIG. 4 of Example 3.

Similar to Example 3, a buffer layer 9 of a double layer structure comprising a BP amorphous low-temperature buffer layer 2 and a BP crystalline buffer layer 8 was provided on a silicon single crystal substrate 1, and thereon, a $GaN_{0.95}P_{0.05}$ single crystal layer having a phosphorus compositional ratio of 5% (X=0.05) was stacked as a lower clad layer 3. Subsequently, an Si-doped n-type $Ga_{0.90}In_{0.10}N$ crystal layer having an average indium compositional ratio of 10% (Y=0.10) was stacked as a light-emitting layer 4 on the lower clad layer 3 comprising the $GaN_{0.95}P_{0.05}$ single crystal layer. The carrier concentration of the $Ga_{0.0}In_{0.10}N$ light-emitting layer 4 was about $8\times10^{17}$ cm$^{-3}$ and the layer thickness thereof was about 20 nm. On the light-emitting layer 4, an upper clad layer 5 comprising an n-type gallium nitride (GaN) layer was stacked similarly to Example 3. The carrier concentration of the upper clad layer 5 was about $2\times10^{17}$ cm$^{-3}$ and the layer thickness thereof was about 0.1 μm. Accordingly, this pn junction-type DH junction light-emitting part structure 42 was composed of n-type $GaN_{0.95}P_{0.05}$ layer/n-type $Ga_{0.90}In_{0.10}$ N layer/p-type GaN layer.

In view of the degree of lattice mismatch, the multilayer system of this Example was constructed as follows.

(i) The degree of lattice mismatch (Δ) between the BP low-temperature buffer layer 2 and the BP crystalline buffer layer 8 was 0 (zero) (namely, these layers were in the lattice matching relationship).

(ii) The degree of lattice mismatch (Δ) between the BP crystalline buffer layer 8 and the $GaN_{0.95}P_{0.05}$ single crystal lower clad layer 3 was 0.4% based on the BP crystalline buffer layer 8.

(iii) The degree of lattice mismatch (Δ) between the lower clad layer 3 comprising $GaN_{0.95}P_{0.05}$ single crystal (a=4.557 Å) and the light-emitting layer 4 comprising cubic $Ga_{0.90}In_{0.10}$ N (a=4.557 Å) was 0 (zero) based on the lattice constant of $GaN_{0.95}P_{0.05}$ (namely, these layers were in the lattice matching relationship).

(iv) The degree of lattice mismatch between the light-emitting layer 4 comprising $Ga_{0.90}In_{0.10}N$ (a=4.557 Å) and the upper clad layer 5 (a=4.510 Å) comprising cubic GaN was 1.0% based on the lattice constant of $Ga_{0.90}In_{0.10}N$.

In the multilayer structure of this Example, the degree of lattice mismatch between the $GaN_{0.95}P_{0.05}$ single crystal layer as the lower clad layer 3 and the $Ga_{0.90}In_{0.10}N$ single crystal layer as the light-emitting layer 4 was made 0 (zero), so that a light-emitting layer 4 reduced in crystal defects attributable to the lattice mismatch could be formed. Accordingly, when observed by a sectional TEM method, it was confirmed that the dislocation density of the $Ga_{0.90}In_{0.10}N$ light-emitting layer 4 was reduced to about $2\times10^5$ cm$^{-2}$.

As shown in FIG. 4, an n-type ohmic electrode 6 comprising Au and a p-type ohmic electrode 7 comprising Al were formed on the front and back surfaces of the multilayer structure using a well-known photolithography technique in the same manner as in Example 2 to fabricate a green LED. A forward operating current was passed to the n-type and p-type ohmic electrodes 6 and 7, and as a result, the following light emission properties were obtained.

(A) Light emission wavelength: 512 nm (B) Luminous emission intensity: 1.6 cd (forward current: 20 mA)

(C) Forward voltage: 3.7 V (forward current: 20 mA)

(D) Backward voltage: 20 V or more (reverse current: 10 μA)

On a structure where a BP low-temperature grown buffer layer and a BP high-temperature grown crystalline buffer layer were superposed, a gallium nitride phosphide lower clad layer having excellent crystallinity and a light-emitting layer having lattice match with the lower clad layer were deposited and thereon, an upper clad layer comprising GaN having a small degree of lattice mismatch was deposited to construct a pn junction-type DH junction light-emitting part structure, so that a group-III nitride semiconductor light-emitting device giving high luminous intensity light emission as above could be obtained.

Example 5

In this Example, the present invention is described by referring to a group-III nitride semiconductor blue light-emitting device having an SH junction light-emitting part structure containing a gallium nitride phosphide light-emitting layer stacked on an electrically conducting GaP substrate via a BP buffer layer. Incidentally, the order of constructing the multilayer structure of the light-emitting device is the same as in Example 1 shown in FIG. 2.

In this Example, unlike Examples 1 to 4, an n-type gallium phosphide (GaP) single crystal having added thereto sulfur (S) was used as a single crystal substrate 21. On the n-type GaP single crystal substrate 21 having a plane azimuth of (100), respective vapor phase grown layers described in the following items (1) to (3) were stacked to construct a light-emitting part structure 52 of pn junction-type SH junction (see, FIG. 2).

(1) A low-temperature buffer layer 22 comprising Si-doped n-type boron phosphide (BP) was grown by the MOCVD method under normal pressure (almost atmospheric pressure) using triethyl borane $((C_2H_5)_3B)$/phosphine $(PH_3)$/hydrogen $(H_2)$ as a starting material gas. During growing, the temperature was 350° C. and the feed ratio (V/III ratio) between $PH_3$ and $(C_2H_5)_3B$ was set to about 300. The obtained boron phosphide layer was mainly composed of an amorphous material in the as-grown state and had a layer thickness of about 20 nm.

(2) On this n-type BP low-temperature buffer layer 22, an Si-doped n-type $GaN_{0.97}P_{0.03}$ single crystal layer of zinc blende crystal structure having a phosphorus compositional ratio of 3% (X=0.03) was formed as a lower clad layer 23 by the MOCVD method using trimethyl gallium $((CH_3)_3Ga)$/ammonia $(NH_3)$/phosphine $(PH_3)$/hydrogen $(H_2)$ as a starting material gas and using disilane $(Si_2H_6)$ as an Si doping source. The growing temperature was about 910° C., the layer thickness was about 1.0 μm and the carrier concentration was about $1\times10^{18}$ cm$^{-3}$.

(3) On the lower clad layer 23, an Mg-doped p-type gallium indium nitride $(Ga_{0.97}In_{0.03}N)$ layer having an indium (In) compositional ratio of about 3% (Y=0.03) was formed as a light-emitting layer 24 by the MOCVD method under normal pressure using trimethyl gallium $((CH_3)_3Ga)$/trimethyl indium $((CH_3)_3In)$/ammonia $(NH_3)$/hydrogen $(H_2)$ as a starting material gas. The growing temperature was 880° C. and the layer thickness was about 0.2 μm.

Accordingly, the light-emitting part structure 52 of pn junction-type SH junction was constructed such that the n-type $GaN_{0.97}P_{0.03}$ single crystal layer was the lower clad layer 23 and the p-type $Ga_{0.97}In_{0.03}N$ layer was the light-emitting layer 24.

The lattice constant a of GaP used for the single crystal substrate 21 is 5.450 Å (see, *III-V Zoku Kagobutsu Handotai* (*Group III-V Compound Semiconductor*) supra, Baifukan, page 148). In view of the degree of lattice mismatch (Δ) calculated based on this, the multilayer structure of this Example was constructed as follows.

(i) The degree of lattice mismatch (Δ) between the BP low-temperature buffer layer 22 and the lower clad layer 23 comprising $GaN_{0.97}P_{0.03}$ single crystal was 0 (zero) based on the BP low-temperature buffer layer (this is, these two layers were in the lattice matching relationship).

(ii) The degree of lattice mismatch (Δ) between $GaN_{0.97}P_{0.03}$(a=4.538 Å) of the lower clad layer 23 and cubic $Ga_{0.97}In_{0.03}N$ (a=4.524 Å) of the light-emitting layer 24 was −0.3% based on the lattice constant of $GaN_{0.97}P_{0.03}$.

As shown in FIG. 2, a p-type ohmic electrode 7 comprising Al and an n-type ohmic electrode 6 comprising Au were formed on the front and back surfaces of the multilayer structure by reversing the vertical positions of Example 1, using a well-known photolithography technique to fabricate a so-called p side-up type blue LED. A forward operating current was passed to the n-type and p-type ohmic electrodes 6 and 7, and as a result, the following emission properties were obtained.

(A) Light emission wavelength: 408 nm (B) Luminous emission intensity: 0.4 cd (forward current: 20 mA)

(C) Forward voltage: 3.7 V (forward current: 20 mA)

(D) Backward voltage: 20 V or more (reverse current: 10 μA)

The SH junction light-emitting part structure was constructed so that a gallium nitride phosphide single crystal layer having excellent crystallinity provided via a BP low-temperature buffer layer was used as the lower clad layer and the lattice mismatch between the light-emitting layer and the lower clad layer was reduced to ±0.4% or less. Therefore, a group-III nitride semiconductor light-emitting device having excellent emission properties described above was obtained.

Comparative Example

A conventional group-III nitride semiconductor blue light-emitting device constructed as shown in FIG. 5 was fabricated and compared on the light emission properties with the group-III nitride semiconductor light-emitting device according to the present invention.

In this Comparative Example, unlike Examples 1 to 5, an insulating (0001) (C face) sapphire (alumina single crystal) was used as the substrate 101. On the sapphire substrate 101, respective vapor phase grown layers described in the following items (1) to (3) were sequentially stacked to construct a light-emitting part structure 42 of pn junction-type DH junction (see, FIG. 5).

(1) A low-temperature buffer layer 102 comprising undoped gallium nitride (GaN) was grown by the MOCVD method under reduced pressure using trimethyl gallium ($(CH_3)_3Ga$)/ammonia ($NH_3$)/hydrogen ($H_2$) as a starting material gas. The growing temperature was 420° C. and the layer thickness was about 17 nm.

(2) On the low-temperature buffer layer 102, a lower clad layer 103 comprising a wurtzite crystal structure hexagonal Si-doped n-type GaN single crystal layer was grown by the MOCVD method using disilane ($Si_2H_6$) as an Si-doping source. The growing temperature was about 1,050° C., the layer thickness was about 3.0 μm and the carrier concentration was about $3 \times 10^{18}$ $cm^{-3}$.

(3) On the lower clad layer 103, an n-type gallium indium nitride mixed crystal ($Ga_{0.97}In_{0.03}N$) layer having an indium (In) compositional ratio of about 3% (Y≈0.03) was grown as a light-emitting layer 104 by the MOCVD method under normal pressure using trimethyl gallium ($(CH_3)_3Ga$)/trimethyl indium ($(CH_3)_3In$)/ammonia ($NH_3$)/hydrogen ($H_2$) as a starting material gas. The growing temperature was 880° C. and the layer thickness was about 0.1 μm.

(4) Subsequently, on the light-emitting layer 104, a wurtzite crystal structure hexagonal Mg-doped p-type GaN single crystal layer was grown as an upper clad layer 105. The growing temperature was about 1,020° C., the layer thickness was about 0.1 μm and the carrier concentration was about $2 \times 10^7$ $cm^{-3}$.

This light-emitting part structure 42 of pn junction-type DH junction was constructed so that the n-type GaN single crystal layer was the lower clad layer 103, the n-type $Ga_{0.97}In_{0.03}N$ layer was the light-emitting layer 104 and the p-type GaN layer was the upper clad layer 105.

In view of the lattice mismatch, the conventional multilayer system of this Comparative Example was constructed as follows.

(i) The degree of lattice mismatch (Δ) between the GaN low-temperature buffer layer 102 and the GaN lower clad layer 103 was 0 (zero) (namely, these two layers were in the lattice matching relationship).

(ii) The degree of lattice mismatch (Δ) between the lower clad layer 103 comprising hexagonal GaN single crystal and the light-emitting layer 104 comprising hexagonal $Ga_{0.90}In_{0.10}N$ (lattice constant of a-axis: 3.222 Å) was 1.1% based on the lattice constant of GaN.

(iii) The degree of lattice mismatch (Δ) between the light-emitting layer 104 comprising $Ga_{0.90}In_{0.10}N$ (lattice constant of a-axis: 3.222 Å) and the upper clad layer 105 comprising hexagonal GaN (a=3.186 Å) was 1.1% based on the lattice constant of GaN.

In the conventional multilayer construction, the degree of lattice mismatch between the GaN low-temperature buffer layer 102 and the GaN single crystal layer constituting the lower clad layer 103 was 0. Nevertheless, when observed by a schematic TEM method, it was confirmed that the dislocation density inside the GaN lower clad layer 103 reached about $2 \times 10^9$ $cm^{-2}$. This is a striking contrast to the case, for example, of Example 1, where the obtained gallium nitride phosphide single crystal layer can be greatly reduced in the density of crystal defects by using the buffer layer comprising BP, although the lattice mismatch with the substrate crystal is larger. Many dislocations in the GaN lower clad layer 103 apparently passed through the hexagonal $Ga_{0.90}In_{0.10}N$ light-emitting layer 104 and the hexagonal GaN upper clad layer 105 and reached the surface of the upper clad layer 105.

For providing an ohmic electrode, the multilayer structure having a light-emitting part structure 42 of pn junction-type DH junction was cut by means of plasma etching. Thereafter, a p-type ohmic electrode 106 was provided on the p-type GaN upper clad layer 105. Also, an n-type ohmic electrode 107 was provided on the surface of the n-type GaN lower clad layer 103 which was exposed by the plasma etching above. Thus, a conventional LED was fabricated.

A forward operating current was passed to the n-type and p-type ohmic electrodes 6 and 7, and as a result, the following light emission properties were obtained.

(A) Light emission wavelength: 418 nm (B) Luminous emission intensity: 0.2 cd (forward current: 20 mA)

(C) Forward voltage: 4.0 V (forward current: 20 mA)

(D) Backward voltage: 15 V or more (reverse current: 10 μA)

When the light emission properties were compared with those of the LED according to the present invention, particularly with the group-III nitride semiconductor blue light-emitting device 20 of pn junction-type SH junction structure described in Example 1, the light emission luminous intensity was as low as ½ and, at the same time, the forward voltage was high. Furthermore, in the conventional LED, dotted light emission spots having high intensity compared with the periphery were present in correspondence to the region where dislocations passed through in the upper clad layer 105 were crowded, and the light emission intensity distribution in the light-emitting region was not uniform. It is presumed that indium (In) aggregates to the region having a high dislocation density within the light-emitting layer 104 of hexagonal $Ga_{0.90}In_{0.10}N$, thereby generating the light emission spots.

When a lamp is manufactured using the group-III nitride semiconductor light-emitting device of the present invention, a high emission intensity lamp can be obtained. A lamp manufactured using the group-III nitride semiconductor light-emitting device of the present invention is described below.

FIG. 6 is a view showing the construction of a lamp manufactured using the group-III nitride semiconductor light-emitting device of the present invention. In the FIG. 6, the lamp 80 comprises a semiconductor light-emitting device 81, a mount lead 82 and an inner lead 83 and is constructed by molding the whole with a transparent resin 84.

For the semiconductor light-emitting device 81, a group-III nitride semiconductor light-emitting device of the present invention, such as a semiconductor light-emitting device manufactured, for example, in Examples 1, 2, 3, 4 or 5 is used. The electrode 81a formed on the back surface of the substrate of the semiconductor light-emitting device 81 is fixed on the mount lead 82 to electrically contact with the mount lead 82. On the other hand, the electrode 81b on the upper surface of the semiconductor light-emitting device 81 is connected to the inner lead 83 by wire bonding.

This lamp 80 uses the group-III nitride semiconductor light-emitting device of the present invention and therefore, has high luminous intensity compared with those using a conventional group-III nitride semiconductor light-emitting device.

This lamp 80 can be used as a lighting fixture for vehicles, a lighting fixture for railway vehicles, a traffic signal light, a crossing signal light, a side back indicator light, a sight line guidance light, a light source of monitor display or console panel display or a light source for office equipment, such as copying machine and facsimile, or for information panel used outdoors. In this case, the light source using the lamp 80 ensures high emission efficiency compared with conventional ones.

In the group-III nitride semiconductor light-emitting device of the present invention, the light-emitting part can be constructed using a gallium nitride phosphide ($GaN_{1-X}P_X$) crystal layer capable of maintaining good lattice matching with the boron phosphide-based buffer layer and having excellent crystallinity, so that a group-III nitride semiconductor light-emitting device ensuring high-intensity emission can be obtained.

In particular, when the boron phosphide-based buffer layer is composed of an amorphous material, the lattice mismatch with the single crystal substrate can be greatly relaxed and a gallium nitride phosphide single crystal layer having good crystallinity can be grown, so that a group-III nitride semiconductor light-emitting device having excellent light emission intensity can be obtained.

When the boron phosphide-based buffer layer is composed of an amorphous and crystal stratified multilayer structure, a light-emitting part can be constructed by disposing a gallium nitride phosphide single crystal layer having good crystallinity on a boron phosphide-based single crystal layer already improved in the crystallinity, so that an effect of giving a group-III nitride semiconductor light-emitting device having excellent light emission intensity can be provided.

When the light-emitting structure is composed of a single hetero-junction structure, the obtained group-III nitride semiconductor light-emitting device can have high-intensity emission with a simple structure.

When the light-emitting structure is composed of a double hetero-junction structure, an effect of giving a group-III nitride semiconductor light-emitting device favored with higher light emission intensity can be provided.

In the present invention, the degree of lattice mismatch between the BP-based buffer layer and the clad layer comprising a gallium nitride phosphide single crystal layer is reduced to ±1% or less and a light-emitting part of a SH or DH junction structure is constructed through this clad layer. That is, a light-emitting part is constructed using a gallium nitride phosphide single crystal layer reduced in the density of crystal defects attributable to the lattice mismatch and having excellent crystallinity, so that an effect of giving a group-III nitride semiconductor light-emitting device having high light emission intensity can be provided.

In the group-III nitride semiconductor light-emitting device of the present invention, the degree of lattice mismatch between the BP-based buffer layer and the lower clad layer is reduced to ±1% or less, particularly ±0.4% or less and therefore, the light-emitting part can be constructed using a gallium nitride phosphide single crystal layer reduced in the density of crystal defects and having excellent crystallinity, so that an effect of giving a group-III nitride semiconductor light-emitting device having high light emission intensity can be provided.

For example, when the BP-based buffer layer is composed of boron phosphide (BP) and the gallium nitride phosphide single crystal layer grown via the BP buffer layer is adjusted to have a phosphorus (P) compositional ratio of 1 to 5%, the light-emitting part can be constructed using a gallium nitride phosphide single crystal layer having good lattice match and excellent crystallinity, so that a group-III nitride semiconductor light-emitting device having high light emission intensity can be simply and readily obtained.

While the invention has been described in detail and with reference to specific embodiments thereof, it will be apparent to one skilled in the art that various changes and modifications can be made therein without departing from the spirit and scope thereof.

What is claimed is:

1. A group-III nitride semiconductor light-emitting device comprising a single crystal substrate having thereon a light-emitting part structure comprising a gallium nitride phosphide (($GaN_{1-X}P_X$, wherein $0<X<1$) single crystal layer provided via a boron phosphide (BP)-based buffer layer, wherein the boron phosphide-based buffer layer comprises a multilayer structure including an amorphous layer and a crystalline layer formed on the amorphous layer, both the amorphous layer and the crystalline layer being made of boron phosphide (BP), the gallium nitride phosphide single crystal layer consisting of $GaN_{0.97}P_{0.03}$ is formed in contact with the crystalline layer of boron phosphide, and a light-emitting layer made of cubic $Ga_{0.94}In_{0.06}Ni$s formed on said gallium nitride phosphide single crystal layer consisting of $GaN_{0.97}P_{0.03}$.

2. The group-III nitride semiconductor light-emitting device as claimed in claim 1, wherein the light-emitting part structure is a single hetero-junction structure comprising a gallium nitride phosphide single crystal layer.

3. The group-III nitride semiconductor light-emitting device as claimed in claim 1, wherein the light-emitting part structure is a double hetero-junction structure comprising a gallium nitride phosphide single crystal layer.

4. A lamp comprising the group-III nitride semiconductor light-emitting device as claimed in claim 1, a mount lead and an inner lead.

5. A light source comprising the lamp as claimed in claim 4.

* * * * *